(12) United States Patent
Yamasaki

(10) Patent No.: US 7,642,627 B2
(45) Date of Patent: Jan. 5, 2010

(54) SEMICONDUCTOR DEVICE

(75) Inventor: Yasuo Yamasaki, Shioziri (JP)

(73) Assignee: Seiko Epson Corporation, Tokyo (JP)

( * ) Notice: Subject to any disclaimer, the term of this patent is extended or adjusted under 35 U.S.C. 154(b) by 344 days.

(21) Appl. No.: 11/461,634

(22) Filed: Aug. 1, 2006

(65) Prior Publication Data
US 2007/0029671 A1    Feb. 8, 2007

(30) Foreign Application Priority Data
Aug. 2, 2005    (JP) .............................. 2005-223804

(51) Int. Cl.
H01L 23/58    (2006.01)
(52) U.S. Cl. ..................... 257/665; 257/688; 257/692
(58) Field of Classification Search ................ 257/665, 257/750, 737, 688, 692
See application file for complete search history.

(56) References Cited

U.S. PATENT DOCUMENTS

| 5,342,207 | A | * | 8/1994 | Sobhani | ................ 439/74 |
| 5,547,740 | A | * | 8/1996 | Higdon et al. | .............. 428/209 |
| 5,874,782 | A | * | 2/1999 | Palagonia | .................... 257/778 |
| 6,097,091 | A | | 8/2000 | Ohsumi | |
| 6,281,111 | B1 | | 8/2001 | Ohsumi | |
| 6,441,487 | B2 | * | 8/2002 | Elenius et al. | .............. 257/738 |
| 6,713,319 | B2 | | 3/2004 | Ohsumi | |
| 6,979,592 | B2 | | 12/2005 | Ohsumi | |
| 7,129,579 | B2 | | 10/2006 | Ohsumi | |
| 2002/0047199 | A1 | * | 4/2002 | Ohuchi et al. | ............... 257/737 |
| 2005/0059200 | A1 | | 3/2005 | Ohsumi | |

FOREIGN PATENT DOCUMENTS

| JP | A 2-272737 | 11/1990 |
| JP | 10-321631 A | 12/1998 |
| JP | 11-067776 A | 3/1999 |
| JP | 2000-091368 A | 3/2000 |
| JP | 2000-232213 A | 8/2000 |

* cited by examiner

Primary Examiner—Leonardo Andújar
(74) Attorney, Agent, or Firm—Oliff & Berridge, PLC

(57) ABSTRACT

A semiconductor device includes a semiconductor substrate having an electrode and a conductive pad; a resin projection formed on the semiconductor substrate; and a wiring electrically connected to the electrode, the wiring having a first portion formed on the electrode, a second portion formed on the conductive pad and a third portion formed on the resin projection between the first portion and the second portion.

10 Claims, 2 Drawing Sheets (A)

(B)

SEMICONDUCTOR DEVICE

The entire disclosure of Japanese Patent Application No. 2005-223804, filed Aug. 2, 2005 is expressly incorporated by reference herein.

BACKGROUND

1. Technical Field

The invention relates to a semiconductor device.

2. Related Art

For the sake of down-sizing of electronic parts, a smaller contour of the semiconductor device is preferred. However, as a roll of the semiconductor device is diversified, high integration of an integrated circuit formed on a semiconductor chip advances. Accordingly, the number of pins for the semiconductor chip becomes large. In other words, such a semiconductor device that can concurrently satisfy two requirements such as the down-sizing of the semiconductor device and the high integration of the integrated circuit is currently under development.

The semiconductor device of a type including a wiring formed on the semiconductor chip is come under spotlight as the one which meets the above stated requirements. In this type of semiconductor device, since the contour of the semiconductor device can be made to have the generally same contour of the semiconductor chip, the down-sizing of the semiconductor device is achievable in comparison with the known semiconductor packages.

The above stated advantageous semiconductor device is also required for a reliability equal to or more than the known semiconductor device. Therefore, the semiconductor device may be subjected to various checks. In order to guarantee the reliability of the semiconductor device, it is important to conduct an electric property check that is highly reliable.

JP-A-02-272737 is an example of related art.

SUMMARY

An advantage of the invention is to provide a semiconductor device capable of being subjected to the electric property check that is highly reliable.

According to an aspect of the invention, a semiconductor device includes a semiconductor substrate having an electrode and a conductive pad, a resin projection formed on the semiconductor substrate, and a wiring which is electrically connected to the electrode and which has a first portion formed on the electrode, a second portion formed on the conductive pad and a third portion formed on the resin projection between the first portion and the second portion. According to an aspect of the invention, the semiconductor device capable of being subjected to the electric property check that is highly reliable can be provided.

In the above stated semiconductor device of the invention, an integrated circuit is formed on the semiconductor substrate, the electrode is electrically connected to the integrated circuit within the semiconductor substrate, but the conductive pad is not necessarily electrically connected to the integrated circuit within the semiconductor substrate.

In the above stated semiconductor device of the invention, the electrode and the conductive pad may be electrically connected to each other within the semiconductor substrate.

In the above stated semiconductor device of the invention, the electrode and the conductive pad may be formed of one piece of conductive member.

In the above stated semiconductor device of the invention, the resin projection may be formed at least between the electrode and the conductive pad.

DESCRIPTION OF EXEMPLARY EMBODIMENTS

Embodiments of the invention will now be described hereinafter with reference to the attached drawings. However, it should be appreciated that the invention is not limited to the embodiments as set forth below.

Figure 1:
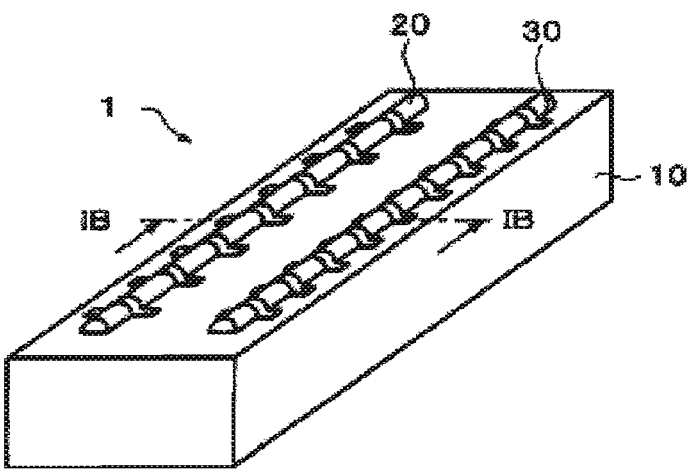
FIGS. 1A and 1B illustrate a semiconductor device according to an embodiment of the invention.
Figure 1:
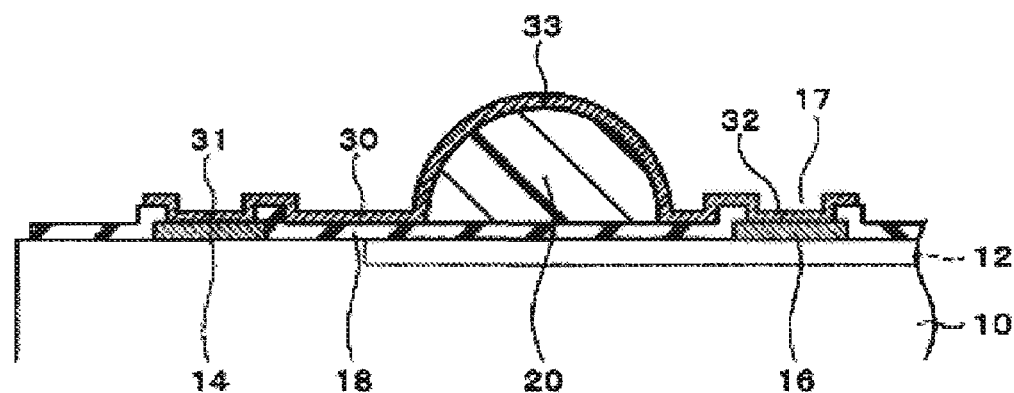

The semiconductor device according to an embodiment of the invention is explained hereinafter referring to the attached drawings. FIGS. 1A to 3 are illustration for showing the semiconductor device according to the embodiment of the invention. Here, FIG. 1A is a schematic view of the semiconductor device 1 according to the embodiment of the invention. FIG. 1B is a cross sectional view taken along a line IB-IB of FIG. 1A.

The semiconductor device according to the embodiment of the invention includes a semiconductor substrate 10. The semiconductor substrate 10 may be, for example, a silicon made semiconductor substrate. The semiconductor substrate 10 may be formed into a chip shape as shown in FIG. 1A. In other words, the semiconductor substrate 10 may be a semiconductor chip. Alternatively, the semiconductor substrate 10 may be formed into a wafer shape, not shown here. The semiconductor substrate 10 may include an area to be a plurality of semiconductor devices. The semiconductor substrate 10 may include the integrated circuit 12 formed thereon. See FIG. 1B. The integrated circuit 12 may have any structure, and may include, for example, an active element such as a transistor and a passive element such as a resistance, a coil or a condenser. In a case that the semiconductor substrate 10 is formed in the chip shape, a surface or an active surface on which the integrated circuit 12 of the semiconductor substrate 10 is formed may have a rectangular shape. See FIG. 1A. Here, however, the active surface of the semiconductor substrate 10 may have a square shape.

The semiconductor substrate 10 has an electrode 14 as shown in FIG. 1B. The electrode 14 may be electrically connected to an electric conductor provided in the semiconductor substrate 10. Here, the electrode 14 may be electrically connected to the integrated circuit 12. Alternatively, the electrode 14 may include the electric conductor which is not electrically connected to the integrated circuit 12. The electrode 14 may be a portion of an interior wiring of the semiconductor substrate 10. Here, the electrode 14 may be a portion of the interior wiring of the semiconductor substrate 10 which is utilized for establishing the electrical connection with the exterior section. The electrode 14 may be formed of metal such as aluminum or copper. The semiconductor substrate 10 may have a plurality of electrodes 14. Here, these electrodes 14 may be arranged along a straight line. These electrodes 14 may be arranged along a side of the active surface. In a case where the active surface of the semiconductor substrate 10 has the rectangular shape, these electrodes 14 may be arranged along a longitudinal side of the rectangular shape of the active surface.

The semiconductor substrate 10 has a conductive pad 16 as shown in FIG. 1B.

The conductive pad 16 may be a conductive member which is not electrically connected to the electrode 14 within the semiconductor substrate 10. The conductive pad 16 may also be the conductive member which is not electrically connected to the integrated circuit 12 within the semiconductor substrate 10. The conductive pad 16 may be formed so as to electrically connected to no conductive member within the semiconductor substrate 10. Here, the conductive pad 16 may be referred to as the so-called dummy pad. The conductive pad 16 may be formed of metal such as aluminum or copper. The conductive pad 16 may be formed of the same material as the electrode 14. Further, the conductive pad 16 may be formed of a material having a spreading property. More specifically, the conductive pad 16 may be formed of the material having the spreading property higher than that of a passivation film 18 or the so-called interlayer insulation film which will be described later. The semiconductor substrate 10 may have a plurality of conductive pads 16. Here, these conductive pads 16 may be arranged along a straight line. These conductive pads 16 may be arranged in parallel with a line of electrodes 14. The conductive pad 16 may be formed on the passivation film 18 which is not shown here but will be described later.

The semiconductor substrate 10, as shown in FIG. 1B, may have the passivation film 18. The passivation film 18 may be so formed that at least a portion of the electrode 14 and a portion of the conductive pad 16 are exposed. The passivation film 18 may have openings through which the electrode 14 and the conductive pad 16 expose. Also, the passivation film 18 may be formed under the conductive pad 16. The passivation film 18 may be an inorganic insulation film such as SiO2 or SiN. The passivation film 18 may be an organic insulation film such as polyimide resin.

The semiconductor device according to the embodiment of the invention, as shown in FIGS. 1A and 1B, includes a resin projection 20 formed on the semiconductor substrate 10. The resin projection 20 is formed on a surface on which the electrode 14 of the semiconductor substrate 10 is also formed. The resin projection 20 may be formed on the passivation film 18. The resin projection 20 is so formed that at lease a portion of the electrode 14 and a portion of the conductive pad 16 are exposed. The resin projection 20 may be formed so as not to overlap the electrode 14. Also, the resin projection 20 may be formed so as not to overlap the conductive pad 16. Further, the resin projection 20 may be arranged between the electrode 14 and the conductive pad 16. Here, the resin projection 20 may be so formed that at least a portion thereof is arranged between the electrode 14 and the conductive pad 16. The resin projection 20 may be formed of any materials including the publicly known materials. For example, the resin projection 20 may be formed of resin such as polyimide resin, silicon modified polyimide resin, epoxy resin, silicon modified epoxy resin, benzocyclobutene (BCB), polybenzoxazole (PBO), and phenolic resin. Also, the resin projection 20 is not limited to a specific shape. For example, the resin projection 20 may be formed into a straight line shape. See FIG. 1A. Here, the resin projection 20 may be formed so as to extend along a side of the semiconductor substrate 10. When the contour of the semiconductor substrate 10 has the rectangular shape, the resin projection 20 may be formed so as to extend along a longitudinal side of the semiconductor substrate as shown in FIG. 1A. Also, as seen in FIG. 1B, a surface of the resin projection 20 may be formed into a curved surface.

Here, the cross sectional shape of the resin projection 20 may be a semicircle shape. The resin projection 20, however, may be a hemispherical shape, which is not shown here.

The semiconductor device according to the embodiment of the invention includes a wiring 30. The wiring 30 is formed so as to reach the resin projection 20. The wiring 30 is drawn out from the electrode 14 to surmount the resin projection 20, resulting in reaching the conductive pad 16. In other words, the wiring 30 is formed to have a first portion 31 formed on the electrode 14, a second portion 32 formed on the conductive pad 16 and a third portion 33 formed on the resin projection 20 between the first portion 31 and the second portion 32. The semiconductor device according to the embodiment of the invention may include a plurality of wirings 30. Here, the plurality of wirings 30 may be formed so as to surmount one resin projection 20. Here, such a formation, not shown, may also be acceptable that one resin projection 20 is provided with only one wiring 30. When one resin projection 20 is provided with only one wiring 30, the resin projection 20 may have the hemispherical shape, not shown. The wiring 30 may be formed so as to contact the electrode 14 and the conductive pad 16. Accordingly, the wiring 30 may be electrically connected to the electrode 14 and the conductive pad 16. Alternatively, the wiring 30 may be formed so as to be electrically connected only to the electrode 14. Namely, the wiring 30 may be formed so as not to be electrically connected to the conductive pad 16. The wiring 30 may be formed with a concave portion 17. The concave portion 17 may be positioned so as to overlap the conductive pad 16. The concave portion 17 may be formed, for example, through the use of a step of the opening of the passivation film 18. The wiring 30 may have any structures and may be formed of any materials. The wiring 30 may be formed, for example, into a single layer. Alternatively, the wiring 30 may be formed into a multiple layer. Here, the wiring 30 may include a first layer formed of titanium tungsten or titanium and a second layer formed of gold, not shown.

Figure 2:
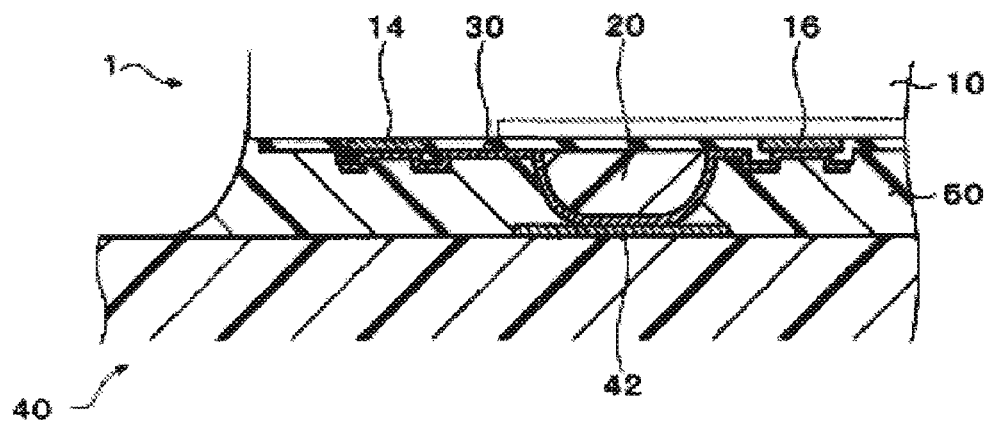
FIG. 2 illustrates the semiconductor device according to the embodiment of the invention.

The semiconductor device 1 according to the embodiment of the invention may have the above described structure. FIG. 2 illustrates a state that the semiconductor device 1 is mounted on the wiring substrate 40. Here, the wiring substrate 40 may be formed of a rigid board such as a glass board or a silicon board, or a flexible board such as a film board. The wiring substrate 40 has an electrical connection section 42. The electrical connection section 42 may be a portion of a wiring pattern formed on the wiring substrate 40. The semiconductor device 1 may be mounted on the wiring substrate 40 in such a manner that a surface including the wiring 30 faces to the wiring substrate 40. Here, the electrical connection section 42 of the wiring substrate 40 and the wiring 30 may be electrically connected to each other through a contact therebetween. More specifically, a portion of the wiring 30 overlapping the resin projection 20 contacts the electrically connection section 42 of the wiring substrate 40 in order to establish the electrical connection therebetween. Accordingly, an elastic power of the resin projection 20 allows the wiring 30 to press against the electrical connection section 42. As such, the semiconductor device having a good electrical connection reliability can be provided. The semiconductor device 1 may be bonded on the wiring substrate 40 by an adhesive 50. The semiconductor device 1 may be secured on the wiring substrate 40 by the adhesive 50. An elastic deformation of the resin projection 20 may be kept by keeping a distance between the semiconductor device 1 and the wiring substrate 40 by means of the adhesive 50.

Figure 3:
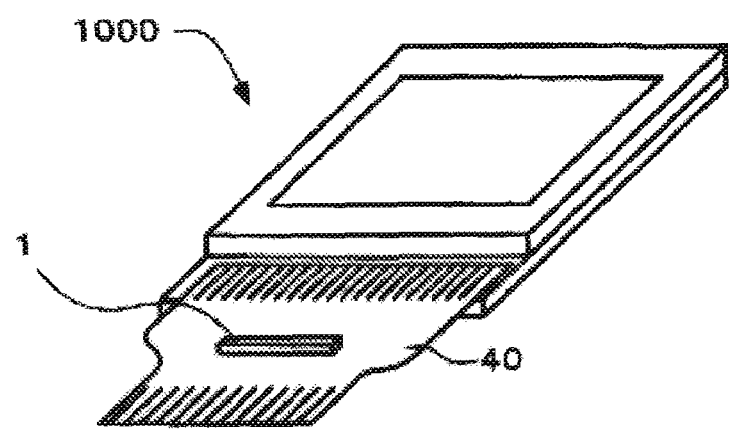
FIG. 3 illustrates the semiconductor device according to the embodiment of the invention.

FIG. 3 shows an electronic module 1000 on which the semiconductor device 1 is mounted. The electronic module

1000 may be a display device. The display device may include, for example, a liquid crystal display or an EL display, namely, an electrical luminescence display. The semiconductor device 1 may be a driver IC for controlling the display device.

According to the semiconductor device 1 according to the embodiment of the invention, it is possible to provide the semiconductor device which is readily subjected to the check process and is capable of avoiding a lowering of the reliability of the semiconductor device after the check process thereof. The advantageous result produced therefrom will be described below.

A semiconductor device is subjected to various checks in order to guarantee a reliability. To check an electric property of the semiconductor device, a probe check is ordinary conducted. In the probe check, it is necessary to electrically connect a probe with an object to be checked. Therefore, such a method that the probe is pressed against the object to be checked to establish a electric connection therebetween is generally taken in the probe check.

The semiconductor device includes the integrated circuit formed therein. In a case that the object to be checked is provided on the integrated circuit, there is a fear that the property of the integrated circuit may change due to a load exerted onto the integrated circuit if the object to be checked is provided on the integrated circuit. If the property of the integrated circuit changes, it becomes difficult to conduct the electric property check having a good reliability. Also, if a frangible material is used immediately below the object to be checked against which the probe is pressed, a pressing force by the probe may destroy the frangible material. If the semiconductor device is destroyed, it becomes difficult to conduct the property check having a good reliability. Furthermore, it becomes impossible to use the semiconductor device as a product.

In the semiconductor device according to the embodiment of the invention, the wiring 30 is formed so as to reach the conductive pad 16. Namely, the wiring 30 is formed so as to overlap the conductive pad 16. The conductive pad 16 is made of a conductive material and has the spread ability. Accordingly, if a large force is exerted onto the conductive pad 16, the conductive pad 16 deforms by itself to absorb the force. That is to say, even if the force is exerted on the conductive pad 16 from the above, the force is hardly transferred to a lower layer of the conductive pad 16. Since the conductive pad 16 is deformable, the conductive pad 16 is nonbreakable. Accordingly, use of an area on the conductive pad 16 corresponding to the wiring 30 will enable the electric property check having a good reliability. Namely, pressing the probe against the area on the conductive pad 16 corresponding to the wiring 30 will enable a high reliable electric property check. More specifically, pressing the probe against the area of the conductive pad 16 corresponding to the wiring 30 will enable an establishment of the electric connection between the probe and the wiring 30 without changing the property of the integrated circuit. Further, in a case that the concave portion 17 is formed on the wiring 30, the electric property check having the good reliability can be preformed efficiently since slipping of the probe is avoidable. Further, in a case that the electrode 14 and the conductive pad 16 are arranged on each side of the resin projection 20, respectively, the reliability of the semiconductor device 1 shall be secured even if a portion of the wiring 30 is destroyed by the probe. That is, in the semiconductor device 1 as shown in FIG. 2, the area or the third portion 33 of the wiring 30 which overlaps the resin projection 20 is used as an exterior terminal. Therefore, if no destruction of the wiring 30 occurs between the electrode 14 and a top of the resin projection 20, it is possible to secure the electrical reliability of the semiconductor device 1. The conductive pad 16 is arranged opposite to the electrode 14 with respect to the resin projection 20. Accordingly, if the destruction occurs in an area of the wiring 30 near the conductive pad 16, the electrical reliability of the semiconductor device 1 still can be secured. The area of the wiring 30, which overlaps the conductive pad 16, may be referred to as a check area.

Figure 4:
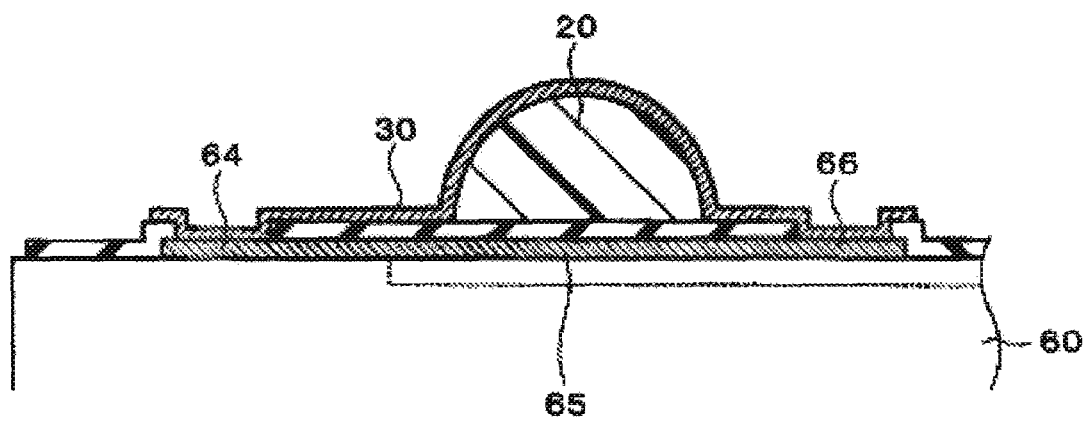
FIG. 4 illustrates a modification of the semiconductor device according to the embodiment of the invention.

FIG. 4 illustrates a modification of the semiconductor device according to the embodiment of the invention.

The semiconductor device according to the embodiment of the invention includes a semiconductor substrate 60. The semiconductor substrate 60 includes an electrode 64 and a conductive pad 66. The electrode 64 and the conductive pad 66 may be electrically connected within the semiconductor substrate 60. Here, the conductive pad 66 may be referred to as a second electrode. The electrode 64 and the conductive pad 66 may be formed of one piece of conductive member 65. Namely, the electrode 64 and the conductive pad 66 may be a portion of the conductive member 65, respectively. Here, the electrode 64 and the conductive pad 66 may be areas of the conductive member 65 exposed from the passivation film. The conductive member 65 may be the interior wiring of the semiconductor substrate 60.

The semiconductor device in accordance with the embodiment of the invention includes the wiring 30. The wiring 30 may be formed so as to be electrically connected to the electrode 64 and the conductive pad 66.

With the semiconductor device as set forth above, the electric property check of high reliability can be performed. Also, the semiconductor device has a structure in which one wiring 30 contacts one signal line at two points. Accordingly, the semiconductor device having electrically high reliability can be provided.

It should be appreciated that the invention is not limited to the above described embodiments but includes various modifications. For example, the invention includes a structure as substantially identical to the structure described in the above embodiment, more specifically, a structure having the same functions, methods and results, or a structure having the same advantages and effects. The invention also includes such a structure that inessential parts of the above stated structure of the embodiment is substituted with the other parts. The invention further includes a structure which can produce the same advantageous result as the above stated structure of the embodiment or a structure which can achieve the same advantage as the above stated structure of the embodiment. The invention still further includes a structure including known art in addition to the structure explained in the above embodiment.

What is claimed is:

1. A semiconductor device comprising:
   a semiconductor substrate that has an electrode and a conductive pad;
   a passivation film that is formed on the semiconductor substrate, a spreading property of a material of the passivation film being lower than a spreading property of a material of the conductive pad;
   a resin projection that is formed on the passivation film; and
   a wiring that is electrically connected to the electrode, the wiring having a first portion formed on the electrode, a second portion formed on the conductive pad and a third portion formed on the resin projection between the first portion and the second portion,
   wherein the electrode and the conductive pad are electrically connected to each other within the semiconductor substrate.

2. The semiconductor device according to claim 1, wherein the semiconductor substrate has an integrated circuit, wherein the electrode is electrically connected to the integrated circuit within the semiconductor substrate, and wherein no conductive pad is electrically connected to the integrated circuit within the semiconductor substrate.

3. The semiconductor device according to claim 1, wherein the resin projection is formed at least between the electrode and the conductive pad.

4. The semiconductor device according to claim 1, wherein the passivation film has a first opening and a second opening, the first opening is disposed on the electrode, the second opening is disposed on the conductive pad, at least a part of the first portion of the wiring is disposed in the first opening, and at least a part of the second portion of the wiring is disposed in the second opening.

5. The semiconductor device according to claim 1, wherein at least a part of the electrode is disposed on a first portion on the semiconductor substrate, at least a part of the conductive pad is disposed on a second portion of the semiconductor substrate, and the first portion of the semiconductor substrate and the second portion of the semiconductor are separated by the resin projection.

6. The semiconductor device according to claim 1, the second portion of the wiring having a concave portion.

7. The semiconductor device according to claim 1, the conductive pad being deformable.

8. A semiconductor device comprising:
a semiconductor substrate that has an electrode and a conductive pad;
an insulation film that is formed on the semiconductor substrate, a spreading property of a material of the insulation film being lower than a spreading property of a material of the conductive pad;
a resin projection that is formed on the insulation film; and
a wiring that is electrically connected to the electrode, the wiring having a first portion formed on the electrode, a second portion formed on the conductive pad and a third portion formed on the resin projection between the first portion and the second portion,
wherein the electrode and the conductive pad are electrically connected to each other within the semiconductor substrate.

9. The semiconductor device according to claim 8, the second portion of the wiring having a concave portion.

10. The semiconductor device according to claim 8, the conductive pad being deformable.

* * * * *